US010361659B2

(12) United States Patent
Henzler et al.

(10) Patent No.: US 10,361,659 B2
(45) Date of Patent: Jul. 23, 2019

(54) POWER ENVELOPE TRACKER AND ADJUSTABLE STRENGTH DC-DC CONVERTER

(71) Applicant: INTEL IP CORPORATION, Santa Clara, CA (US)

(72) Inventors: Stephan Henzler, Munich (DE); Wenjian Wang, Neubiberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/466,810

(22) Filed: Mar. 22, 2017

(65) Prior Publication Data
US 2018/0278213 A1    Sep. 27, 2018

(51) Int. Cl.
| H03F 1/30 | (2006.01) |
|---|---|
| H03F 1/02 | (2006.01) |
| H02M 3/158 | (2006.01) |
| H03F 3/195 | (2006.01) |
| H03F 3/24 | (2006.01) |

(52) U.S. Cl.
CPC .......... *H03F 1/0227* (2013.01); *H02M 3/158* (2013.01); *H03F 3/195* (2013.01); *H03F 3/245* (2013.01); *H03F 2200/102* (2013.01); *H03F 2200/432* (2013.01); *H03F 2200/451* (2013.01); *H03F 2200/78* (2013.01)

(58) Field of Classification Search
CPC ....................................................... H03F 1/30
USPC ....................................... 330/297, 296, 285
See application file for complete search history.

(56) References Cited

U.S. PATENT DOCUMENTS

| 7,741,910 | B2* | 6/2010 | Wong ................. | H03F 1/0205 330/260 |
|---|---|---|---|---|
| 8,975,960 | B2* | 3/2015 | Strange ............... | H03F 1/0222 330/127 |
| 9,525,350 | B2* | 12/2016 | Hari .................... | H02M 1/15 |
| 2005/0030770 | A1 | 2/2005 | Sutardja et al. | |
| 2009/0027925 | A1* | 1/2009 | Kanouda ............ | H02M 1/4233 363/21.13 |
| 2014/0077870 | A1 | 3/2014 | Liu et al. | |
| 2015/0069983 | A1* | 3/2015 | Hawawini ........... | H02M 3/158 323/271 |
| 2015/0326123 | A1 | 11/2015 | Shun et al. | |
| 2016/0036389 | A1* | 2/2016 | Balteanu ............. | H02M 3/155 330/252 |
| 2016/0156317 | A1* | 6/2016 | Inoue .................. | H03F 1/0233 330/291 |

FOREIGN PATENT DOCUMENTS

| JP | 2008306905 | 12/2008 |
|---|---|---|
| WO | 2009020939 | 2/2009 |

OTHER PUBLICATIONS

International Search Report and Written Opinion dated Jun. 5, 2018 for PCT Application No. PCT/US18/19183.

* cited by examiner

*Primary Examiner* — Henry Choe
(74) *Attorney, Agent, or Firm* — Green, Howard & Mughal LLP

(57) ABSTRACT

An apparatus is provided which comprises: a low-side switch; at least two high-side switches coupled to the low-side switch; a supply boost circuitry coupled to one of the at least two high-side switches; and a high-side switch selection circuit which is operable to enable one of the at least two high-side switches according to a relative difference between a signal and a threshold.

24 Claims, 8 Drawing Sheets

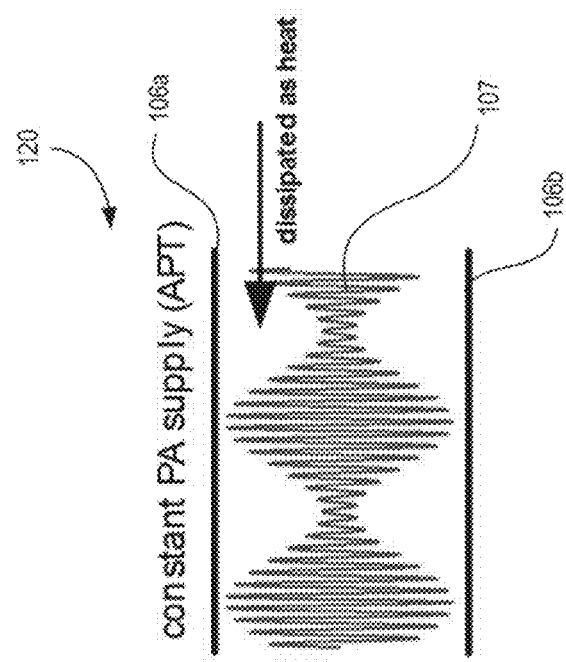
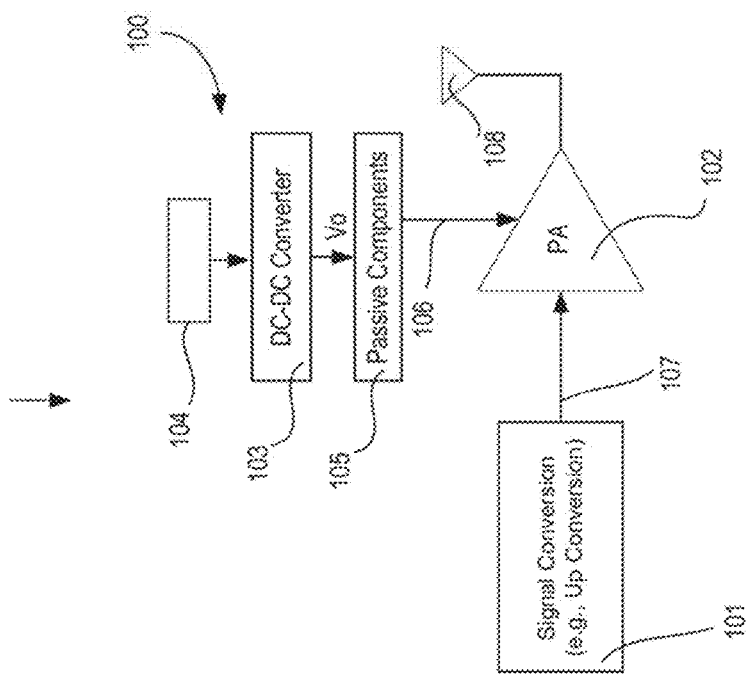
Fig. 1B
Fig. 1A

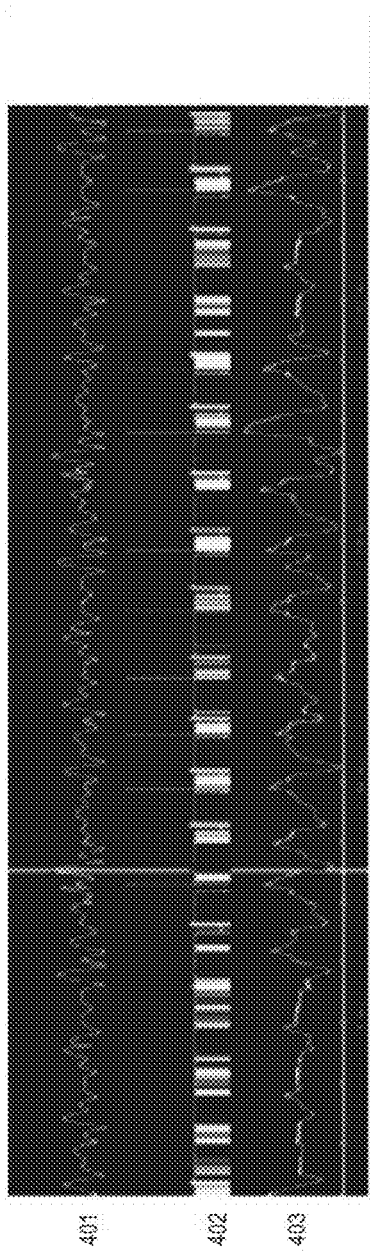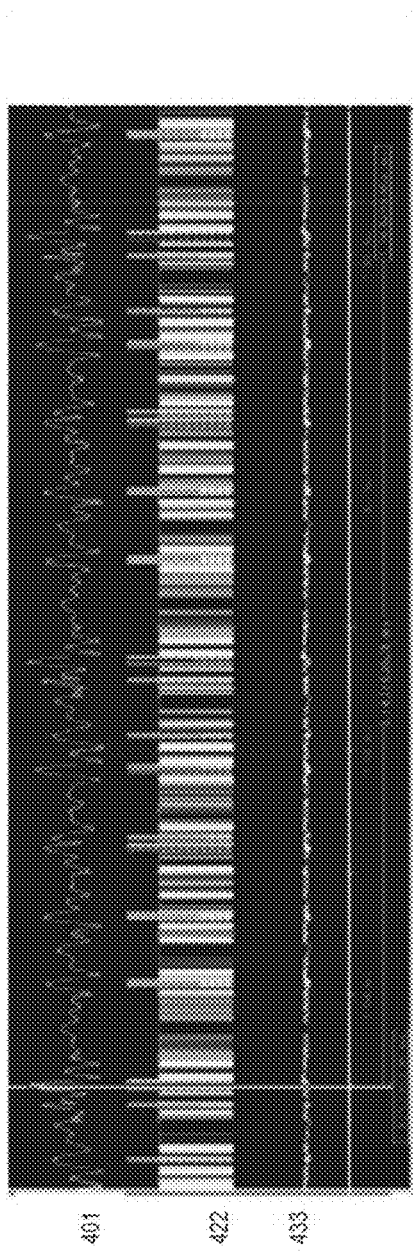

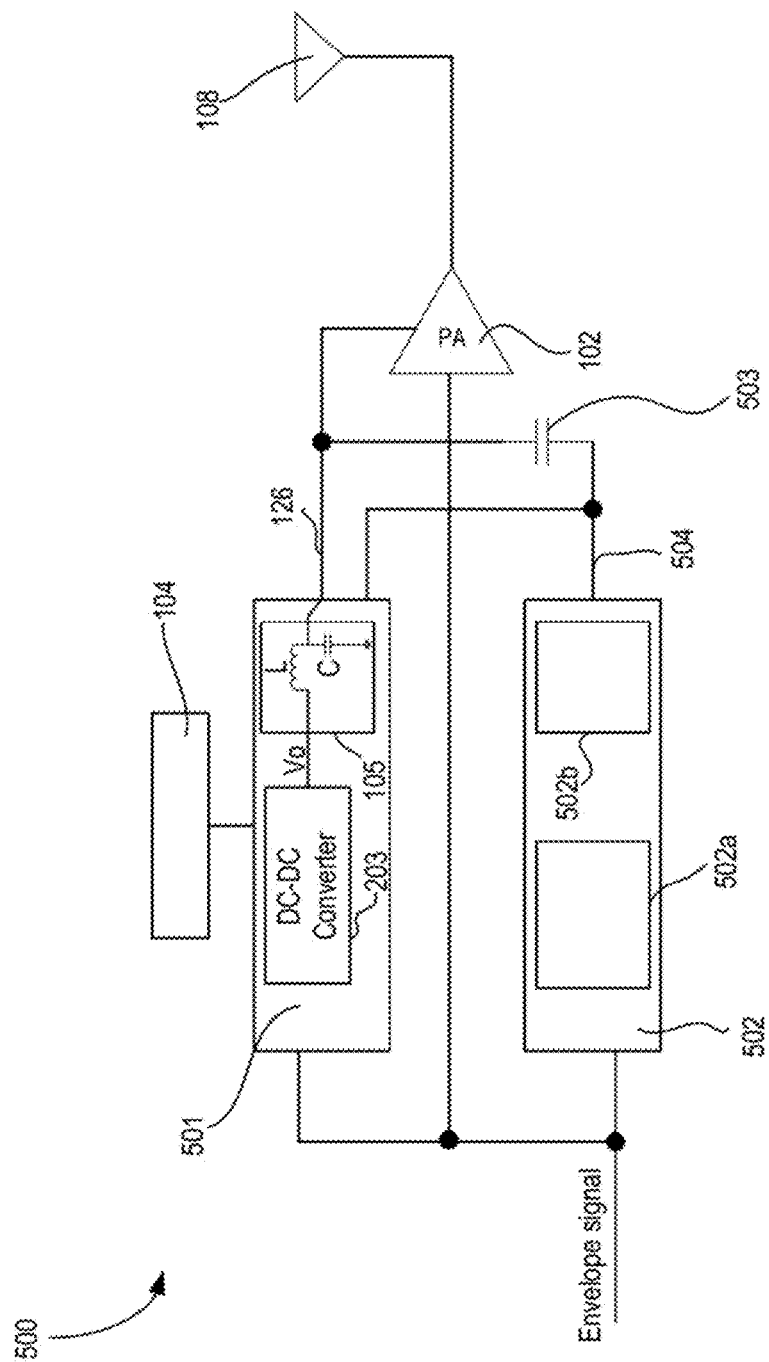

POWER ENVELOPE TRACKER AND ADJUSTABLE STRENGTH DC-DC CONVERTER

BACKGROUND

An envelope tracker system is usually built for communication systems to supply power amplifiers (PA) in 3G, 4G, 5G or WLAN systems. Here, xG (where 'x' is a number) such as 3G, 4G, and 5G refers to the generation of wireless mobile telecommunication technology which is based on a set of standards used for mobile devices and mobile telecommunications.

Average Power Tracking (APT) is used to set a fixed supply voltage to a PA for a certain time interval. As such, in APT mode of operation, the PA supply voltage is constant and adjusted to the transmitter (TX) power level. In the envelope tracking mode (ET), the supply voltage follows the RF (radio frequency) envelope, however. It is desirable to also supply 2G PAs from the same device in an APT mode of operation. This means that much higher DC (Direct Current) must be delivered with a lower voltage difference between a battery and a supply output.

In 4G communication systems such as 4G complaint smart phones, the RF PA is a significant consumer of power. For example, when the PA is transmitting an LTE (Long Term Evolution) compliant signal, the PA becomes the single biggest power-consuming component in the phone. Due to the higher average transmit powers of LTE, the RF PA in an LTE handset consumes ten times the power compared to a PA transmitting a 3G voice call, for example.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 1A-B illustrate a high-level transmitter front-end providing constant supply to the power amplifier, and corresponding plot showing an RF signal envelope signal received by the power amplifier.

FIGS. 4A-B illustrate plots showing performance of DC-DC converter of FIG. 1A and FIG. 3, respectively, according to some embodiments.

FIG. 5 illustrates an envelope tracking system using the DC-DC converter apparatus of FIG. 3, in accordance with some embodiments.

DETAILED DESCRIPTION

Figure 2B:
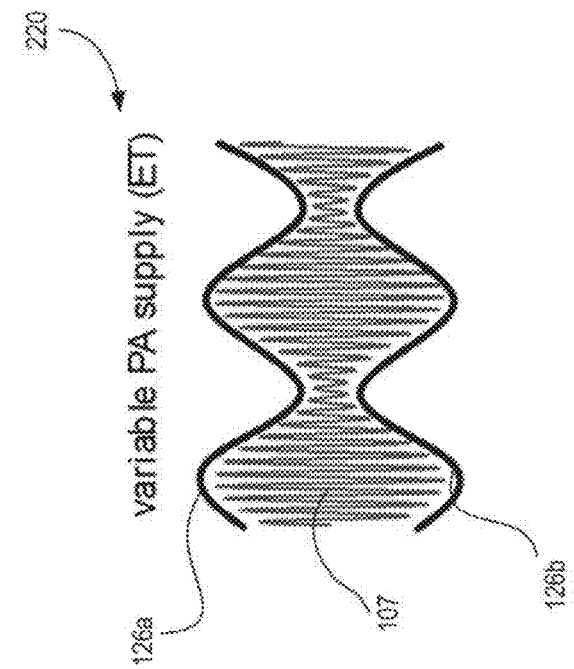
FIGS. 2A-B illustrate a high-level transmitter front-end providing variable supply to the power amplifier, and corresponding plot showing the RF signal envelope signal received by the power amplifier, according to some embodiments of the disclosure.

FIGS. 1A-B illustrate a high-level transmitter front-end 100 providing constant supply to a power amplifier (PA), and corresponding plot 120 showing the RF (radio frequency) signal envelope signal received by the PA. Front-end 100 comprises a signal conversion circuitry 101 (e.g., for up/down conversion of an input signal), PA 102, DC-DC converter 103, external power source 104 (e.g., battery), passive components 105 (e.g., inductor, capacitor, etc.), and antenna 108. The output of the DC-DC converter Vo is provided to passive components 105 to generate a constant regulated output supply 106 for PA 102. The output of signal conversion circuitry 101 is an amplitude and phase modulated signal 107 (e.g., an RF signal which is amplitude modulated) which is provided as input to PA 102. PA 102 then amplifies RF signal 107 using the constant regulated output supply 106 so that antenna 108 can transmit it out.

PA 102 receives RF signal 107 which is normally both amplitude and phase modulated. If all the maxima of the rapidly varying input RF signal 197 are connected by a line, an envelope is formed. This line (e.g., 1066a/b) is then supplied to an envelope tracker to generate PA supply 126. Plot 120 illustrates the constant power supply 106a/b provided to PA 102 and RF signal 107. Here, the white gaps between the RF signal 107 and constant power supply 106a/b are the heat or wasted energy by PA 102.

Most of the time in traditional RF PAs such as PA 102 of FIG. 1A, the supply voltage 106 is far higher than it needs to be, and the excess power is dissipated as heat in PA 102. For example, when signal 106 is an OFDM (orthogonal frequency-division multiplexing) signal, then up to 80% of the energy in PA 102 is typically wasted using a fixed power supply 106. One way to reduce this wasted power is envelope tracking. Envelope tracking is a power supply technique that replaces the fixed DC supply voltage to the RF PA with a very high bandwidth dynamic supply voltage, which closely tracks the amplitude, or envelope of the transmitted RF signal. Some embodiments described here use envelope tracking to reduce the wasted power.

Generally, an envelope signal is provided to a combination of DC-DC converters and/or amplifiers which provide an envelope modulated supply voltage for an RF PA (e.g., PA 102). For example, a DC-DC converter having a fast response or a high bandwidth amplifier is coupled to another DC-DC converter (e.g., converter 103) having a slower response. Traditionally a DC signal is provided by a slowly switching DC-DC buck converter and an AC signal is provided by the fast switching DC-DC converter (or by a wideband amplifier). Both converters may be coupled via a coupling capacitor which is charged to a constant voltage, called shift voltage.

For short signal peaks in the envelope signal received by the combination of DC-DC converters and/or amplifier, the output supply voltage provided by the DC-DC converter and or amplifier can go even above the battery voltage (e.g., input voltage provided by block 104). In this situation the slow DC-DC buck converter cannot follow the input supply voltage from the battery. However, the output signal is dynamically generated by lifting (in terms of voltage) the bottom node of the coupling capacitor which couples the combination of DC-DC converters and/or amplifiers.

If the high signal peaks in the envelope signal have a longer duration, however, the coupling capacitor is discharged during the peak. Thus, the power supply signal of the power amplifier collapses during the peak which degrades the EVM (error vector magnitude) performance.

Another challenge is that the coil current (or inductor current) through an inductor in block 103 coupled to the slow DC-DC converter (e.g., converter 103) collapses during the peak which leads to strong transients and a contention between the slow and the fast converters. This degrades additionally noise performance and efficiency.

One possible way to solve the above problem is to boost the battery voltage (e.g., voltage provided by block 104) above the maximum signal peak voltage and to supply the slow buck converter (e.g., converter 103) with this input voltage. However, such a solution may cause permanent cascading of a boost and the buck converter, which degrades the overall system efficiency.

Various embodiments describe a dual input DC-DC buck converter which can be operated either from a battery directly or from a boosted supply voltage. In some embodiments, a comparator is provided in the slow DC-DC converter which receives the target envelope signal (e.g., signal 107) and compares it to a predefined threshold. In some embodiments, when the envelope signal is below the threshold, the battery input is used which results in higher efficiency. In some embodiments, when the envelope signal (e.g., signal 107) is above the threshold the boosted supply is used resulting in possible reduced efficiency but good overall performance (e.g., signal tracking and no coil current reversal). In some embodiments, as the envelope signal stays below the threshold for the majority of the time, higher average efficiency is achieved while still fulfilling EVM and noise requirements for long signal peaks.

As such, in some embodiments, either the battery voltage or the boosted supply voltage is used for the slow DC-DC buck converter. For example, the high or boosted voltage is used when functionally needed and the battery voltage (which is lower than the boosted voltage) is used otherwise. Therewith, both good RF performance and good system efficiency can be achieved. As the slow DC-DC converter uses a high supply voltage during signal peaks, the coil current does not collapse, over-react or oscillate anymore which leads to better efficiency. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 2A:
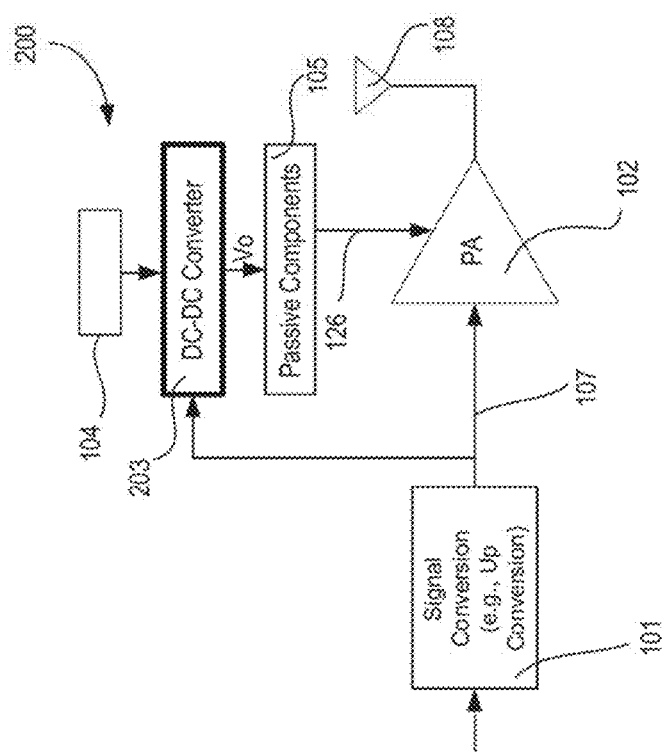

FIGS. 2A-B illustrate a high-level transmitter front-end 200 providing variable supply to the power amplifier, and corresponding plot 220 showing RF signal envelope signal received by the PA, according to some embodiments of the disclosure. It is pointed out that those elements of FIGS. 2A-B having the same reference numbers (or names) as the elements of any other figure can operate or function in any manner similar to that described, but are not limited to such.

FIG. 2A is similar to FIG. 1A except that adaptive supply control is performed using envelope tracking. In some embodiments, DC-DC converter 203 is provided (that replaces DC-DC converter 103) to generate adaptive power supply 126 which follows amplitude characteristics of envelope signal 107. In some embodiments DC-DC converter also includes a second DC-DC converter and/or amplifier coupled to the first DC-DC converter. In some embodiments, DC-DC converter 203 also includes two separate high-side switches coupled to a low-side switch, where one of the high-side switch is coupled to a supply node which receives power supply from source 104 (e.g., battery) while the other high-side switch receives a boosted power supply. In some embodiments, the boosted power supply is provided by a boosting circuitry which receives input from source 104 and generates a higher supply from it. In some embodiments, the boosting circuitry is a charge pump. In some embodiments, the boosting circuitry is a DC-DC boost converter. In some embodiments, the boosted supply voltage is supplied to the circuit from outside.

In some embodiments, DC-DC converter 203 includes a comparator and switch circuitry, where the comparator compares the amplitude of the envelope or target signal 107 with a threshold (e.g., programmable or predetermined threshold), and the output of the comparator controls the switch circuitry (e.g., a multiplexer, de-multiplexer, etc.). In some embodiments, the switch circuitry causes one of the high-side switches to be enabled (e.g., turned on) and the other of the high-side switches to be disabled (e.g., turned off) according to the output of the comparator.

In some embodiments, when the envelope signal based off of signal 107 is below the threshold, the battery input (e.g., output of battery 104) is used by enabling the high-side switch directly coupled to the battery input which results in high efficiency. In some embodiments, when the envelope signal based off of signal 107 is above the threshold, the boosted supply is used by enabling the high-side switch coupled to the boosting circuitry. In some embodiments, as the the envelope signal based off of signal 107 stays below the threshold for the majority of the time, high efficiency is achieved while still fulfilling EVM and noise requirements for long signal peaks.

As such, in some embodiments, either the battery voltage or the boosted supply voltage is used by DC-DC buck converter 203. As DC-DC converter 203 uses a high supply voltage during signal peaks, the coil current of inductor in block 105 does not collapse, over-react, or oscillate anymore which leads to better efficiency.

FIG. 2B illustrates plot 220 showing envelope tracking power supply 126 which is provided to PA 102. Compared to plot 220, here the gaps between RF signal 107 and power supply 126a/b is reduced or eliminated. The lines 126a/b also represent the envelop of signal 107 as it tracks RF signal 107. As such, power is saved and efficiency of PA 102 of FIG. 2A improves over PA 102 of FIG. 1A.

Figure 3:
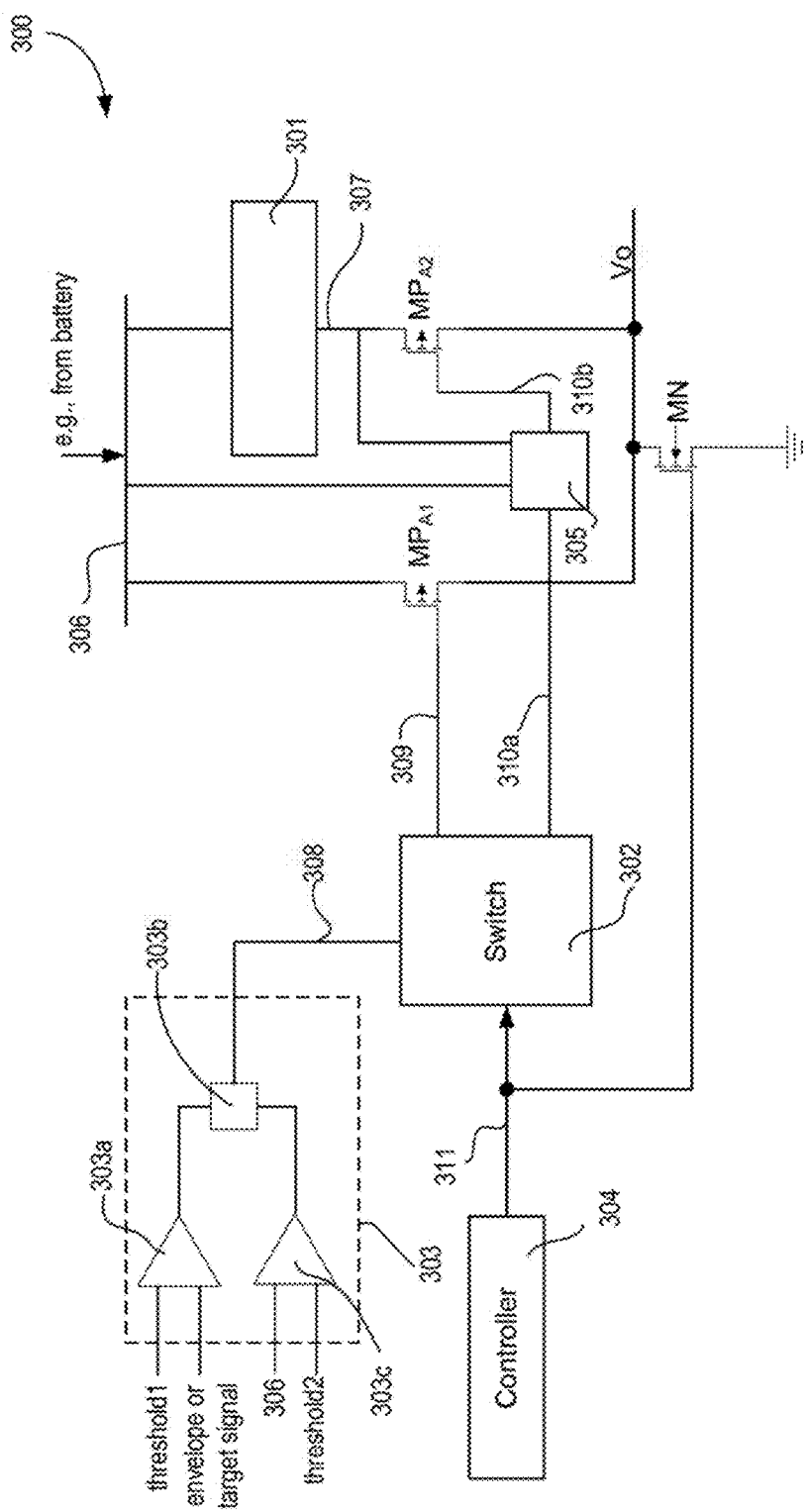
FIG. 3 illustrates an apparatus, which is part of a DC-DC converter, for envelope tracking, according to some embodiments of the disclosure.

FIG. 3 illustrates apparatus 300, which is part of a DC-DC converter (e.g., 203), for envelope tracking, according to some embodiments of the disclosure. It is pointed out that those elements of FIG. 3 having the same reference numbers (or names) as the elements of any other figure can operate or function in any manner similar to that described, but are not limited to such.

Apparatus 300 comprises boosting circuitry 301, switch 302, comparator circuitry 303, controller 304, first p-type high-side switch $MP_{A1}$, second p-type high-side switch $MP_{A2}$, low-side switch MN, level-shifter 305, first supply node 306, second supply node 307, switch control node 308, first switch control node 309, second switch control node 310a, second switch level-shifted control node 310b, and bridge control node 311. In some embodiments, in electrical path 309 there is may also be a level shifter (not shown).

In some embodiments, boost circuitry 301 is coupled to first supply node 306 and second supply node 307. In some embodiments, first supply node 306 is coupled to an output of supply source 104. For example, first supply node 306 is coupled to a battery (for instance, a phone battery). In some embodiments, boosting circuitry 301 comprises a DC-DC boost converter. In some embodiments, boosting circuitry 301 comprises a charge pump. In some embodiments, boosting circuitry 301 provides a regulated supply to second supply node 307 and this regulated supply is higher than the input supply on first supply node 306. Here, reference to node and signal is interchangeably used. For example, reference 308 may refer to a switch control node or a switch control signal depending on the context of the sentence.

In some embodiments, when the voltage level on first supply node 306 falls below a threshold, then absent boosting circuitry 301, first high-side switch $MP_{A1}$ may not be able to provide a high enough Vo to Passive Components 105 for proper operation of PA 102. To solve that problem (and other issues), boosting circuitry 301 is provided which allows the second high-side switch $MP_{A2}$ to provide the expected voltage on Vo. In some embodiments, level-shifter 305 is provided to level shift signal on node 310a to a higher voltage level signal on node 310b so that the second high-side switch $MP_{A2}$ can be fully turned off/on. While the various embodiments show a single transistor for the high-side switches and the low-side switch MN, several transistors can be coupled together in parallel to implement these switches.

In some embodiments, the low-side switch MN is controlled by control signal on node 311. In some embodiments, the same control signal is also selectively provided to either first high-side switch $MP_{A1}$ or second high-side switch $MP_{A2}$ depending on the logic condition of signal on node 308, which is an output of comparison circuitry 303. In some embodiments, control signal on node 311 is provided by controller 304 which is a one of: pulse width modulator (PWM), pulse frequency modulator (PFM), a constant on-time modulator, a constant off-time modulator, or a combination them. For example, control signal on node 311 is one of a pulse width modulated signal, a pulse frequency modulated signal, a constant on-time modulated signal, a constant off-time modulated signal, or a combination of these signals.

In some embodiments, switch 302 is a de-multiplexer with switch control node 308 being the select node, bridge control node 311 being the input node, and first switch control node 309 and second switch control node 310a being the first and second outputs, respectively. In some embodiments, one of the first p-type high-side switch $MP_{A1}$ or the second p-type high-side switch $MP_{A2}$ is enabled by the outputs from switch 302. In some embodiments, switch 302 is bypassed to allow both first p-type high-side switch $MP_{A1}$ or second p-type high-side switch $MP_{A2}$ to be controlled by signal on switch control node 308 simultaneously as described with reference to FIG. 6.

Referring back to FIG. 3, in some embodiments, comparator circuitry 303 comprises at least one comparator 303a that compares envelope or target signal 107 with threshold1. In some embodiments, threshold1 is a predetermined threshold. In some embodiments, threshold1 is a programmable threshold which can be programmable by hardware (e.g., fuse, register, etc.) or software (e.g., operating system). In some embodiments, threshold1 is equal to a voltage level of first supply node 306 plus an offset voltage (e.g., +10 mV), or threshold1 is equal to a voltage level of the first supply node 306 minus an offset voltage (e.g., −10 mV). In some embodiments, the output of comparator 303a is directly coupled to node 308 (or via one or more buffers). In some embodiments, another comparator 303c is provided that compares the voltage on first supply node 306 with threshold2, where threshold2 is separate and different from threshold1. In some embodiments the threshold is dependent on a voltage measurement combined with a programmable offset value. The measured voltage can be, for example, the voltage at first supply node 306, in accordance with some embodiments.

In some embodiments, comparator 303c operates in parallel to comparator 303a, and their results are logically compared by logic 303b. In some embodiments, logic 303b is a NOR gate, OR gate, AND gate, NAND gate, or a combination of them. In some embodiments, when the voltage level on node 306 falls below threshold2, logic 303b causes output 308 to enable the second high-side switch $MP_{A2}$ to ensure that the output Vo does not fall below a fail-safe level (below which PA 102 may not operate properly). In one such embodiments, logic 303b is a NOR or OR gate.

In some embodiments, the envelope or target signal is compared to a first threshold (threshold1) by comparator 303a. In some embodiments, a second comparator 303c is provided which is used to compare the battery voltage at node 306 to a second threshold (threshold2). In some embodiments, transistor $MP_{A2}$ is then used to switch when either the envelope or target signal is above threshold1 or when the battery voltage is below threshold2. In some embodiments, threshold1 can be also referred to the battery voltage.

In some embodiments, output 308 of comparator circuitry 303 causes switch 303 (or high-side switch selection circuit) to couple the second high-side switch $MP_{A2}$ to control node 311 if a voltage level of signal 107 is below threshold1. In some embodiments, output of 308 of comparator circuitry 303 causes switch 303 (or high-side switch selection circuit) to couple the first high-side switch $MP_{A1}$ to control node 311 if a voltage level of signal 107 is above threshold1.

In some embodiments, the output node Vo (which is coupled to the high-side and low-side switches) is coupled to an inductor which is to be coupled to a capacitor, and wherein the inductor and the capacitor are to be coupled to a power supply node of PA 102. In some embodiments, Passive Components 105 (which include the inductor and capacitor) are off-die elements. For example, passive components 105 are located on a printed circuit board (PCB) or package of a chip. In some embodiments, passive components 105 are on-die elements. For example, the inductor and capacitor may be integrated in a substrate on which the active side of die is formed.

In some embodiments, the low-side switch MN; the two high-side switches $MP_{A1}$ and $MP_{A2}$; and the supply boost circuitry 301 are part of a first DC-DC converter subsystem. For example, supply boost circuitry 301 may be considered as another DC-DC converter. In some embodiments, supply boost circuitry 301 is coupled to one or more of: a second DC-DC converter, a charge pump, or a linear amplifier.

FIGS. 4A-B illustrate plots 400 and 420, respectively, showing performance of DC-DC converter of FIG. 1A and FIG. 3, respectively, according to some embodiments. Here, x-axis is time and y-axis is voltage or current depending on the waveform. Plot 400 illustrates simulation results of DC-DC converter 103 coupled to Passive Components 105. Waveform 401 is envelope signal 107 with y-axis being voltage representing the amplitude of envelope signal 107, waveform 402 is signal on switching node Vo, and waveform 403 is current through the inductor of Passive Components 105 coupled to the output Vo of DC-DC converter 103. Ideally this current should be flat. However, waveform 403 has many ripples that cause noise on the output supply voltage 106 provided to PA 102. The voltage on the switching node V0 toggles between ground and battery voltage (e.g., voltage supplied by block 104). As the coil current 403 collapses during high peaks, an over-reaction and oscillation of the coil current are the consequence.

Plot 420 illustrates simulation results of DC-DC converter 203 coupled to Passive Components 105. Waveform 401 is envelope signal 107 with y-axis being voltage representing the amplitude of envelope signal 107, waveform 422 is the signal on the switching node Vo of apparatus 300, and waveform 433 is the current flowing through the inductor of Passive Components 105 coupled to the output Vo of DC-DC converter 203. During high peaks of envelope signal 107, the boosted supply voltage 307 is used. This can be seen by the higher switching peaks of the voltage on switching node Vo. During lower phases of the envelope 107, the battery voltage 306 is used. As a result the envelope signal 107 is properly tracked and the coil current 433 stays flat. (Note, here the node Vo where the two p-type devices and the n-type device come together is usually called switching node of a DC-DC converter, and signal on node 311 may be called switch control signal. The output of a DC-DC converter is normally the node where a coil and an output capacitor come together.)

FIG. 5 illustrates an envelope tracking system 500 using the DC-DC converter apparatus of FIG. 3, in accordance with some embodiments. It is pointed out that those elements of FIG. 5 having the same reference numbers (or names) as the elements of any other figure can operate or function in any manner similar to that described, but are not limited to such.

Generally, envelope signal (e.g., signal 107) is provided to a combination of DC-DC converters and/or amplifiers which provide an amplitude modulated supply voltage for an RF PA (e.g., PA 102). For example, a DC-DC converter having a fast response or a high bandwidth amplifier is coupled to another DC-DC converter (e.g., converter 103) having a slower response. Traditionally a DC signal is provided by a slowly switching DC-DC buck converter and an AC signal is provided by the fast switching DC-DC converter (or by an amplifier). Both converters are coupled via a coupling capacitor which is charged to a constant voltage, called shift voltage.

For short signal peaks in the envelope signal received by the combination of DC-DC converters and/or amplifier, the output supply voltage provided by the DC-DC converter can go even above the battery voltage (e.g., input voltage provided by block 104). In this situation, the DC-DC buck converter cannot follow the input supply voltage from the battery. However, the output signal is dynamically generated by lifting (in terms of voltage) the bottom node of the coupling capacitor which couples the combination of DC-DC converters and/or amplifiers.

If the high signal peaks in the envelope signal have a longer duration, however, the coupling capacitor is discharged during the peak. Thus, the power supply of the power amplifier collapses during the peak which degrades the EVM (Error Vector Magnitude) performance.

Various embodiments describe system 500 having a dual input DC-DC buck converter which can be operated either from an external power source such as battery directly or from a boosted supply voltage. System 500 comprises first regulator 501, second regulator or amplifier 502, power source 104, power amplifier 102, coupling capacitor 503, and antenna 108. In some embodiments, first regulator 501 comprises DC-DC converter 203/300 (also referred to as a slow DC-DC converter) coupled to passive components 105 (e.g., inductor L and capacitor C). The output 126 of first regulator 501 provides power to PA 102. In some embodiments, the second regulator or amplifier 502 includes another DC-DC converter 502a (also referred to as a fast DC-DC converter) or a linear amplifier 502a, or a charge pump, and corresponding passive elements 502b. In some embodiments, the response time of second regulator or amplifier 502 is faster than the response time of first regulator 501. Both blocks 501 and 502 receive envelope signal 107. The output of second regulator or amplifier 502 is 504.

Node 504 is provides the output of second regulator 501. In some embodiments, the output on node 504 is fed back to second regulator 501 as a feedback signal and also to first regulator 501 as a feedback signal. In some embodiments, first regulator 501 uses a combination of two feedback signals (e.g., 126 and 504) as a combined feedback signal. In some embodiments, the difference between the two feedback signals 126 and 504 is used by first regulator 501. In some embodiments, coupling capacitor 503 is coupled to the output nodes 126 and 504.

In some embodiments, comparator circuitry 303 is provided in the slow DC-DC converter 501 which receives the target envelope signal and compares it to a predefined threshold1. In some embodiments, when the envelope signal is below the threshold1, the battery input from block 104 is used which results in higher efficiency. In some embodiments, when the envelope signal is above threshold1, the boosted supply 307 is used. In some embodiments, as the envelope signal stays below threshold1 for the majority of the time, higher efficiency is achieved while still fulfilling EVM and noise requirements for long signal peaks.

As such, in some embodiments, either the battery voltage or the boosted supply voltage is used for the slow DC-DC buck converter 501. For example, the high or boosted voltage is used when such functionally is needed and the battery voltage (which is lower than the boosted voltage) is used otherwise. Therewith both good RF performance and good system efficiency can be achieved. As the slow DC-DC converter 501 uses a high supply voltage during signal peaks, the coil current does not collapse, over-react or oscillate anymore which leads to better efficiency.

Figure 6:
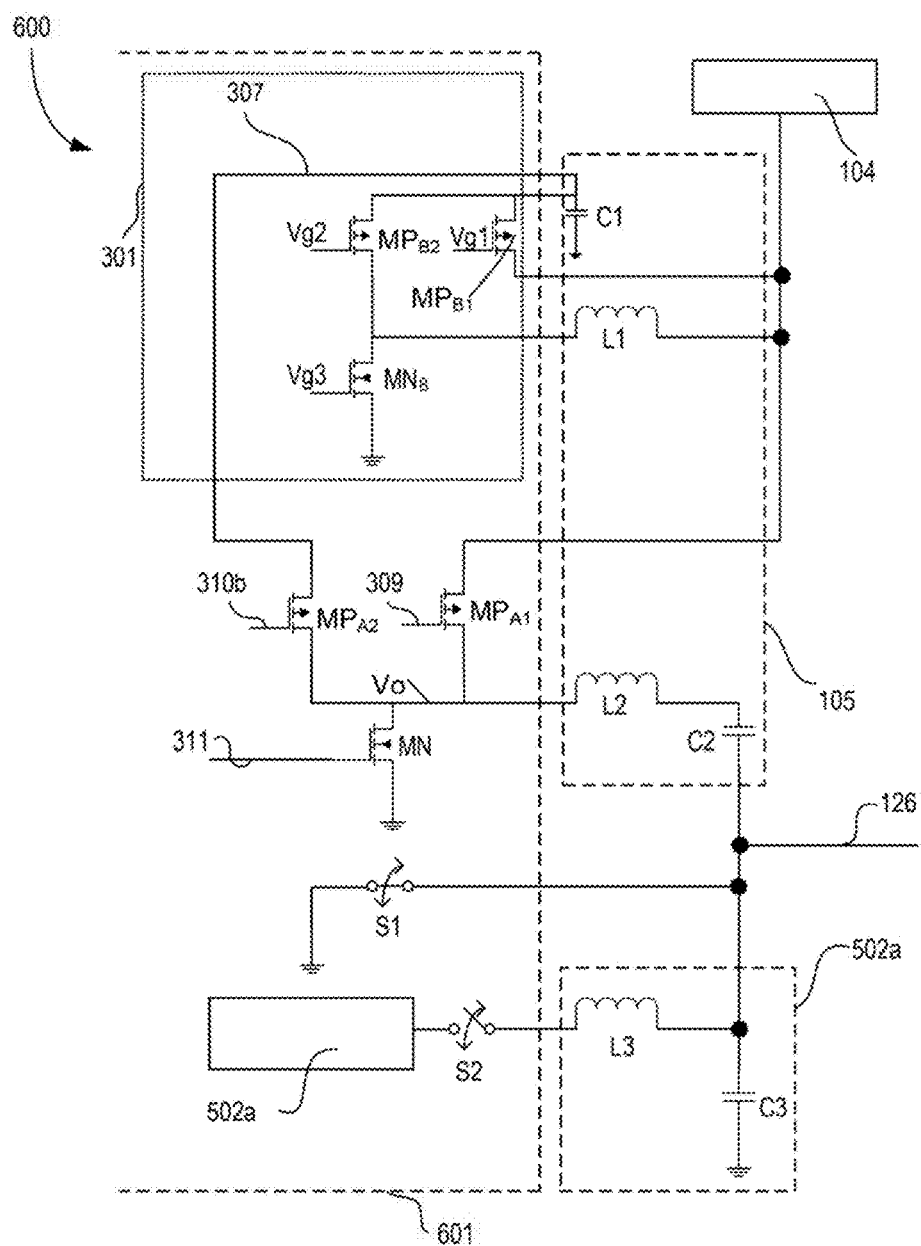
FIG. 6 illustrates an envelope tracking system using a DC-DC converter apparatus which is operable to bypass a boost converter or charge pump, according to some embodiments of the disclosure.

FIG. 6 illustrates an envelope tracking system 600 using a DC-DC converter apparatus which is operable to bypass a boost converter or charge pump, according to some embodiments of the disclosure. It is pointed out that those elements of FIG. 6 having the same reference numbers (or names) as the elements of any other figure can operate or function in any manner similar to that described, but are not limited to such.

In some use cases, the dual input buck converter is operated as a single input buck converter. This is important when very high output currents need to be provided with a very low DC-DC switch resistance. In this case, the boost circuit 301 needs to be bypassed. For example, the battery voltage is not boosted but simply forwarded to node 307. Then the supply voltage of the first and second high-side transistors $MP_{A1}$ and $MP_{A2}$ is the same and both switches can be used simultaneously and in parallel.

In some embodiments, a two input DC-DC buck converter is provided with boosting supply circuitry 301 in one of the input paths. In some embodiments, the DC-DC buck converter contains means to operate both high-side switches in parallel, when a control instance detects that the two input voltages are made equal (e.g., voltage on source terminals of the high-side switches $MP_{A1}$ and $MP_{A2}$). In various embodiments, a desired switch resistance is achieved with the already present power devices. Thus no area increase or efficiency degradation occurs, in accordance with some embodiments.

In some embodiments, envelope tracking system 600 comprises active area 601, passive components 105 and 502*a*, and power source 104 (e.g., battery). In some embodiments, active area 601 includes DC-DC converter 203/300, wide-band DC-DC converter or linear amplifier 502*a*, or charge pump, and switches S1 and S2 coupled together as shown. In some embodiments, by-pass switch $MP_{B1}$ is added between the battery input supply, inductor L1 and load capacitor C1. In some embodiments, DC-DC converter 203/300 includes boosting voltage circuitry 301, high-side switches $MP_{A1}$ and $MP_{A2}$, low-side switch MN coupled together as shown. In some embodiments, boosting voltage circuitry 301 is a DC-DC boost converter which includes high-side switch $MP_{B2}$, bypass switch $MP_{B1}$, and low-side switch $MN_B$ such that high-side switch $MP_{B2}$ is controlled by Vg2, bypass switch $MP_{B1}$ is controlled by Vg1, and low-side switch $MN_B$ is controlled by Vg3. In some embodiments, voltages Vg2 and Vg3 originate from the same node, and may have the same logic level.

In some embodiments, a DC-DC buck converter 203/300 is operated either from battery 104 directly or from boosted supply voltage 307. In some embodiments, for 2G PA, DC-DC buck converter 203/300 runs from the battery 104 and never from boosted supply voltage 307. One reason for this bypassing of boosting supply circuitry 301 is efficiency degradation due to boosting, parasitic path resistance and feasibility of coil currents in the boosting supply circuitry 301. In some embodiments, boosting supply circuitry 301 is put to bypass mode so it supplies the second high-side switch $MP_{A2}$ with the battery voltage as well. Then the two high-side switches $MP_{A1}$ and $MP_{A2}$, respectively, are operated in parallel which leads effectively to a wider (or larger with higher drive current) high-switch transistor. In some embodiments, during the by-pass mode, low-side switch $MN_B$ of boosting supply circuitry 301 is turned off while the high-side switch $MP_{B2}$ and the by-pass switch $MP_{B1}$ are turned on. As such, both source terminal of the high-side switches $MP_{A1}$ and $MP_{A2}$ have substantially the same voltage (e.g., voltage from source 104).

In some embodiments, during the by-pass mode, switch S1 is closed which couples a ground terminal to load capacitor C2 which is coupled to inductor coil L2. In this case, switch S2 is off (or open) to de-couple the fast DC-DC converter or linear amplifier 502*a* from its passive devices 502*a* (e.g., inductor L3 and capacitor C3).

Figure 7:
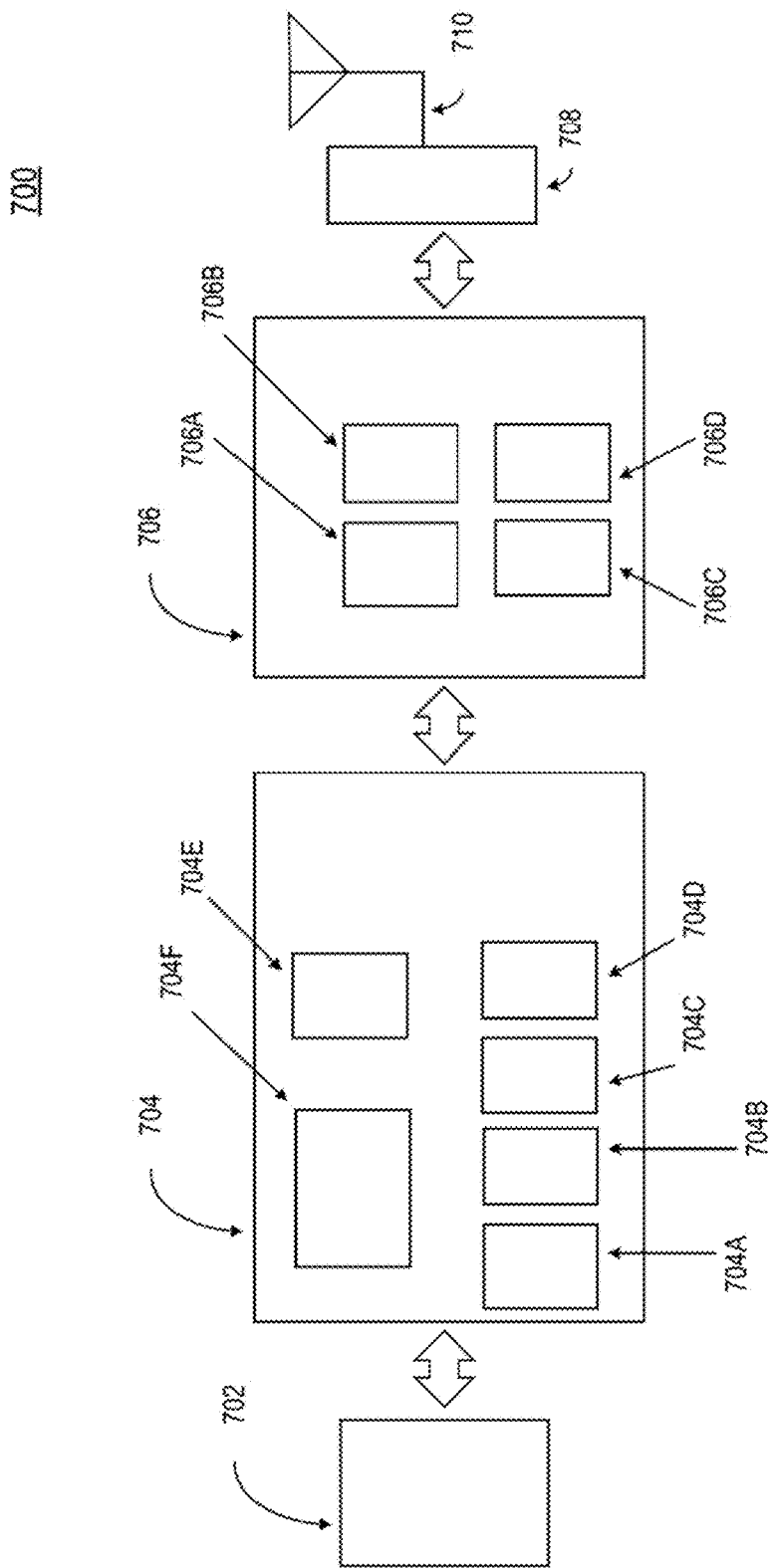
FIG. 7 illustrates example components of a UE (user equipment) device with the DC-DC converter apparatus, in accordance with some embodiments of the disclosure.

FIG. 7 illustrates example components of UE device 700 with the DC-DC converter apparatus, in accordance with some embodiments of the disclosure. In some embodiments, a UE device 700 may include application circuitry 702, baseband circuitry 704, Radio Frequency (RF) circuitry 706, front-end module (FEM) circuitry 708, a low-power wake-up receiver (LP-WUR), and one or more antennas 710, coupled together at least as shown. In some embodiments, the UE device 700 may include additional elements such as, for example, memory/storage, display, camera, sensor, and/or input/output (I/O) interface.

The application circuitry 702 may include one or more application processors. For example, the application circuitry 702 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 704 may include circuitry such as, but not limited to, one or more single-core or multi-core processors. The baseband circuitry 704 may include one or more baseband processors and/or control logic to process baseband signals received from a receive signal path of the RF circuitry 706 and to generate baseband signals for a transmit signal path of the RF circuitry 706. Baseband processing circuitry 704 may interface with the application circuitry 702 for generation and processing of the baseband signals and for controlling operations of the RF circuitry 706. For example, in some embodiments, the baseband circuitry 704 may include a second generation (2G) baseband processor 704A, third generation (3G) baseband processor 704B, fourth generation (4G) baseband processor 704C, and/or other baseband processor(s) 704D for other existing generations, generations in development or to be developed in the future (e.g., fifth generation (5G), 6G, etc.). The baseband circuitry 704 (e.g., one or more of baseband processors 704A-D) may handle various radio control functions that enable communication with one or more radio networks via the RF circuitry 706. The radio control functions may include, but are not limited to, signal modulation/demodulation, encoding/decoding, radio frequency shifting, etc. In some embodiments, modulation/demodulation circuitry of the baseband circuitry 704 may include Fast-Fourier Transform (FFT), precoding, and/or constellation mapping/demapping functionality. In some embodiments, encoding/decoding circuitry of the baseband circuitry 704 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 704 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or RRC elements. A central processing unit (CPU) 704E of the baseband circuitry 704 may be configured to run elements of the protocol stack for signaling of the PHY, MAC, RLC, PDCP and/or RRC layers. In some embodiments, the baseband circuitry may include one or more audio digital signal processor(s) (DSP) 704F. The audio DSP(s) 704F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 704 and the application circuitry 702 may be implemented together such as, for example, on a system on a chip (SOC).

In some embodiments, the baseband circuitry 704 may provide for communication compatible with one or more radio technologies. For example, in some embodiments, the baseband circuitry 704 may support communication with a EUTRAN and/or other wireless metropolitan area networks (WMAN), a wireless local area network (WLAN), a wireless personal area network (WPAN). Embodiments in which the baseband circuitry 704 is configured to support radio communications of more than one wireless protocol may be referred to as multi-mode baseband circuitry.

RF circuitry 706 may enable communication with wireless networks using modulated electromagnetic radiation through a non-solid medium. In various embodiments, the RF circuitry 706 may include switches, filters, amplifiers, etc. to facilitate the communication with the wireless network. RF circuitry 706 may include a receive signal path which may include circuitry to down-convert RF signals received from the FEM circuitry 708 and provide baseband signals to the baseband circuitry 704. RF circuitry 706 may also include a transmit signal path which may include circuitry to up-convert baseband signals provided by the baseband circuitry 704 and provide RF output signals to the FEM circuitry 708 for transmission.

In some embodiments, the RF circuitry 706 may include a receive signal path and a transmit signal path. The receive signal path of the RF circuitry 706 may include mixer circuitry 706A, amplifier circuitry 706B and filter circuitry 706C. The transmit signal path of the RF circuitry 706 may include filter circuitry 706C and mixer circuitry 706A. RF circuitry 706 may also include synthesizer circuitry 706D for synthesizing a frequency for use by the mixer circuitry 706A of the receive signal path and the transmit signal path. In some embodiments, the mixer circuitry 706A of the receive signal path may be configured to down-convert RF signals received from the FEM circuitry 708 based on the synthesized frequency provided by synthesizer circuitry 706D. The amplifier circuitry 706B may be configured to amplify the down-converted signals and the filter circuitry 706C may be a low-pass filter (LPF) or band-pass filter (BPF) configured to remove unwanted signals from the down-converted signals to generate output baseband signals. Output baseband signals may be provided to the baseband circuitry 704 for further processing. In some embodiments, the output baseband signals may be zero-frequency baseband signals, although this is not a requirement. In some embodiments, mixer circuitry 706A of the receive signal path may comprise passive mixers, although the scope of the embodiments is not limited in this respect.

In some embodiments, RF circuitry 706 includes apparatus 300. In some embodiments, RF circuitry 706 includes PA 102, first voltage regulator 501 and second voltage regulator and/or amplifier 502. In some embodiments, RF circuitry 706 includes active region 601.

In some embodiments, the mixer circuitry 706A of the transmit signal path may be configured to up-convert input baseband signals based on the synthesized frequency provided by the synthesizer circuitry 706D to generate RF output signals for the FEM circuitry 708. The baseband signals may be provided by the baseband circuitry 704 and may be filtered by filter circuitry 706C. The filter circuitry 706C may include a low-pass filter (LPF), although the scope of the embodiments is not limited in this respect.

In some embodiments, the mixer circuitry 706A of the receive signal path and the mixer circuitry 706A of the transmit signal path may include two or more mixers and may be arranged for quadrature down-conversion and/or up-conversion respectively. In some embodiments, the mixer circuitry 706A of the receive signal path and the mixer circuitry 706A of the transmit signal path may include two or more mixers and may be arranged for image rejection (e.g., Hartley image rejection). In some embodiments, the mixer circuitry 706A of the receive signal path and the mixer circuitry 706A may be arranged for direct down-conversion and/or direct up-conversion, respectively. In some embodiments, the mixer circuitry 706A of the receive signal path and the mixer circuitry 706A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 706 may include analog-to-digital converter (ADC) and digital-to-analog converter (DAC) circuitry and the baseband circuitry 704 may include a digital baseband interface to communicate with the RF circuitry 706.

In some dual-mode embodiments, a separate radio IC circuitry may be provided for processing signals for each spectrum, although the scope of the embodiments is not limited in this respect.

In some embodiments, the synthesizer circuitry 706D may be a fractional-N synthesizer or a fractional N/N+1 synthesizer, although the scope of the embodiments is not limited in this respect as other types of frequency synthesizers may be suitable. For example, synthesizer circuitry 706D may be a delta-sigma synthesizer, a frequency multiplier, or a synthesizer comprising a phase-locked loop with a frequency divider.

The synthesizer circuitry 706D may be configured to synthesize an output frequency for use by the mixer circuitry 706A of the RF circuitry 706 based on a frequency input and a divider control input. In some embodiments, the synthesizer circuitry 706D may be a fractional N/N+1 synthesizer.

In some embodiments, frequency input may be provided by a voltage controlled oscillator (VCO), although that is not a requirement. Divider control input may be provided by either the baseband circuitry 704 or the applications processor 702 depending on the desired output frequency. In some embodiments, a divider control input (e.g., N) may be determined from a look-up table based on a channel indicated by the applications processor 702.

Synthesizer circuitry 706D of the RF circuitry 706 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 706D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency ($f_{LO}$). In some embodiments, the RF circuitry 706 may include an IQ/polar converter.

FEM circuitry 708 may include a receive signal path which may include circuitry configured to operate on RF signals received from one or more antennas 710, amplify the received signals and provide the amplified versions of the received signals to the RF circuitry 706 for further processing. FEM circuitry 708 may also include a transmit signal path which may include circuitry configured to amplify signals for transmission provided by the RF circuitry 706 for transmission by one or more of the one or more antennas 710.

In some embodiments, the FEM circuitry 708 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 706). The transmit signal path of the FEM circuitry 708 may include a power amplifier (PA) to amplify input RF signals (e.g., provided by RF circuitry 706), and one or more filters to generate RF signals for subsequent transmission (e.g., by one or more of the one or more antennas 710.

In some embodiments, the UE 700 comprises a plurality of power saving mechanisms. If the UE 700 is in an RRC_Connected state, where it is still connected to the eNB as it expects to receive traffic shortly, then it may enter a state known as Discontinuous Reception Mode (DRX) after a period of inactivity. During this state, the device may power down for brief intervals of time and thus save power.

If there is no data traffic activity for an extended period of time, then the UE 700 may transition off to an RRC_Idle state, where it disconnects from the network and does not perform operations such as channel quality feedback, handover, etc. The UE 700 goes into a very low power state and it performs paging where again it periodically wakes up to listen to the network and then powers down again. Since the device might not receive data in this state, in order to receive data, it should transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

In addition, in various embodiments, an eNB device may include components substantially similar to one or more of the example components of UE device 700 described herein.

Figure 8:
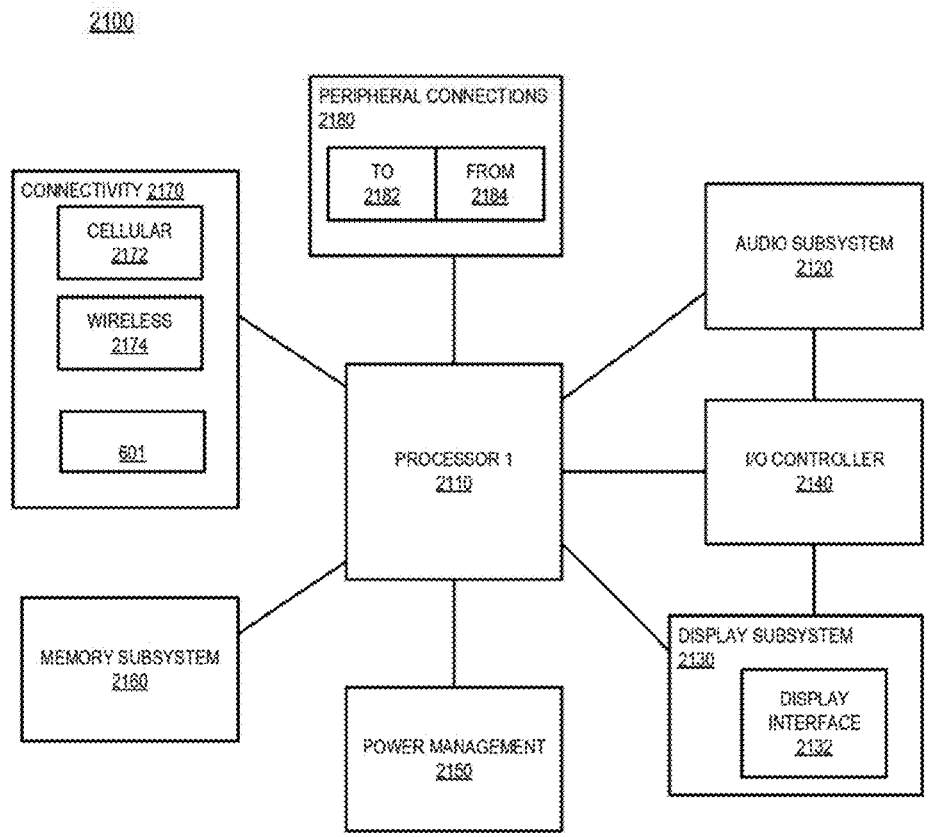
FIG. 8 illustrates a smart device or a computer system or a SoC (System-on-Chip) with a DC-DC converter apparatus, according to some embodiments.

FIG. 8 illustrates a smart device or a computer system or a SoC (System-on-Chip) with a DC-DC converter apparatus, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, DC-DC converter apparatus 200/300/600 (or active regions of them) are provided in connectivity 2170. In this example, block 601 is shown as part of connectivity 2170. However, other blocks of DC-DC converter apparatus 200/300/600 may also be present in connectivity 2170, in accordance with some embodiments. For example, active components of apparatus 200/300/600 are provided connectivity 2170 while passive components (e.g., 105, 502*a*) are off die or on-package. In some embodiments, the passive components (e.g., 105, 502*a*) are embedded in the substrate of the SOC.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a low-side switch; at least two high-side switches coupled to the low-side switch; a supply boost circuitry coupled to one of the at least two high-side switches; and a high-side switch selection circuit which is operable to enable one of the at least two high-side switches according to a difference between a signal and a threshold.

Example 2 includes all features of example 1, wherein the other high-side switch of the least two high-side switches is coupled to a supply node.

Example 3 includes all features of example 2, wherein the supply boost circuitry is coupled to the supply node.

Example 4 includes all features of example 2, wherein the supply node is coupled to an external power supply source.

Example 5 includes all features of example 4, wherein the external power supply source is one of a battery or converter.

Example 6 includes all features of example 2, wherein the supply boost circuitry is to provide an elevated supply to the one of the at least two high-side switches compared to a supply on the first supply node.

Example 7 includes all features of example 2, wherein the threshold is equal to a voltage level of the supply node plus an offset voltage, or wherein the threshold is equal to a voltage level of the supply node minus an offset voltage.

Example 8 includes all features of example 1, wherein the apparatus of example 8 comprises a level-shifter coupled to an output of the high-side switch selection circuit and the one of the at least two high-side switches which is coupled to the supply boost circuitry.

Example 9 includes all features of example 1, wherein the low-side switch is coupled to a control node which is also coupled to the high-side switch selection circuit.

Example 10 includes all features of example 9, wherein the control node is to provide one of: a pulse width modulated (PWM) signal, a pulse frequency modulated (PFM) signal, a constant on-time modulated signal, or a constant off-time modulated signal, or a signal formed by combination a combination of the above.

Example 11 includes all features of example 9, wherein the apparatus of example 11 comprises a comparator to: cause the high-side switch selection circuit to couple one of the at least two high-side switches to the control node if a voltage level of the signal is above the threshold; and cause the high-side switch selection circuit to couple the other of the at least two high-side switches to the control node if a voltage level of the signal is below the threshold.

Example 12 includes all features of example 1, wherein the low-side switch and the at least two high-side switches are coupled to an inductor which is to be coupled to a capacitor, and wherein the inductor and the capacitor are to be coupled to a power amplifier.

Example 13 includes all features of example 1, wherein the supply boost circuitry comprises a charge pump or a boost DC-DC converter.

Example 14 includes all features of example 1, wherein the low-side switch; the at least two high-side switches; and the supply boost circuitry are part of a first DC-DC converter which is coupled to one or more of: a second DC-DC converter, a charge pump, or a linear amplifier.

Example 15 is a system which comprises: a power amplifier; an inductor coupled to the power amplifier; a capacitor coupled to the inductor and the power amplifier; a DC-DC converter coupled to the inductor, wherein the DC-DC converter comprises an apparatus which includes: a low-side switch; at least two high-side switches coupled to the low-side switch; a supply boost circuitry coupled to one of the at least two high-side switches; and a high-side switch selection circuit which is operable to enable one of the at least two high-side switches according to an output of a comparison circuitry.

Example 16 includes all features of example 15, wherein the comparison circuitry comprises: a first comparator to compare a signal and with a first threshold; and a second comparator to compare a battery voltage with a second threshold separate from the first threshold, wherein the battery voltage is also provided to the supply boost circuitry.

Example 17 includes all features of example 16, wherein the signal is an envelope signal, and wherein the threshold is equal to the battery voltage plus an offset voltage, or wherein the threshold is equal to the battery voltage minus an offset voltage.

Example 18 is an apparatus which comprises: a bridge including: a low-side switch; a first high-side switch coupled to the low-side switch and to a first supply node; a supply boost circuitry coupled to the first supply node; and a second high-side switch coupled to the low-side switch and to the supply boost circuitry; and circuitry coupled to the bridge, wherein the circuitry is to compare an envelope signal with a threshold and to generate an output indicating a compare result, wherein the output is to cause the first high-side switch to couple to a control node when a supply on the first supply node is greater than a supply provided by the supply boost circuitry to the second high-side switch.

Example 19 includes all features of example 18, wherein the output is to cause the second high-side switch to couple to the control node when the supply on the first supply node is less than the supply provided by the supply boost circuitry to the second high-side switch.

Example 20 includes all features of example 18, wherein the threshold is equal to a voltage level of the supply plus an offset voltage, or wherein the threshold is equal to a voltage level of the supply minus an offset voltage.

Example 21 includes all features of example 18, wherein the second high-side switch is only used when its input voltage is larger than the supply on the firs supply node.

Example 22 is a method which comprises: comparing an envelope signal with a threshold; boosting a first supply to a second supply; and coupling, in response to comparing, one of: a first high-side switch to a control node when the first supply provided to the first low-side switch is lower than the second supply or a second high-side switch to the control node when the first supply provided to the first low-side switch is higher than the second supply.

Example 23 includes all features of example 22, wherein the first high-side switch is coupled to the control node when the envelope signal is below the threshold.

Example 24 includes all features of example 22, wherein the second high-side switch is coupled to the control node when the envelope signal is above the threshold.

Example 25 includes all features of example 22, wherein the threshold is equal to a voltage level of the first supply plus an offset voltage, or wherein the threshold is equal to a voltage level of the first supply minus an offset voltage.

Example 26 is an apparatus which comprises: a first high-side switch coupled to a first supply node; a second high-side switch coupled to a second supply node; a first low-side switch coupled to the first and second high-side switches; a third high-side switch coupled to the first supply node; and a fourth high-side switch coupled to the second supply node, wherein the first supply node is to be coupled to the second supply node via the third and fourth high-side switches.

Example 27 includes all features of example 26, wherein the apparatus of example 27 comprises a second low-side switch coupled to the third high-side switch.

Example 28 includes all features of example 26, wherein the apparatus of example 26 comprises logic to: turn off the second low-side switch; turn on the third high-side switch; and turn on the fourth high-side switch.

Example 29 is an apparatus which comprises: a first DC-DC converter; a second DC-DC converter coupled to the first DC-DC converter, wherein the second DC-DC converter has a slower response than the first DC-DC converter, and wherein the second DC-DC converter comprises: a first supply node; a low-side switch; a first high-side switch coupled to the low-side switch and to the first supply node; a supply boost circuitry coupled to the first supply node; and a second high-side switch coupled to the low-side switch and to the supply boost circuitry.

Example 30 includes all features of example 29, wherein the second DC-DC converter comprises a comparator which is to compare a signal with a threshold.

Example 31 includes all features of example 30, wherein the second DC-DC converter comprises a switch which is controllable by an output of the comparator, and wherein the switch is to couple either the first high-side switch or the second high-switch to a control node.

Example 32 includes all features of example 31, wherein the switch comprises logic which is to couple the output of the comparator to the first and second high-side switches.

Example 33 includes all features of example 31, wherein the second DC-DC converter comprises a level shifter coupled to the switch and the second high-side switch.

Example 34 includes all features of example 31, wherein the low-side switch is coupled to the control node.

Example 35 includes all features of example 31, wherein the control node is to provide one of: a pulse width modulated (PWM) signal, a pulse frequency modulated (PFM) signal, a constant on-time modulated signal, or a constant off-time modulated signal, or a signal formed by combination a combination of the above.

Example 36 includes all features of example 30, wherein the first supply node is to be coupled to a battery which is to provide a battery supply to the first supply node.

Example 37 includes all features of example 36, wherein the supply boost circuitry is to provide an elevated voltage to the second high-side switch compared to the battery supply.

Example 38 includes all features of example 36, wherein the threshold is equal to a voltage level of the battery supply plus an offset voltage, or wherein the threshold is equal to a voltage level of the battery supply minus an offset voltage.

Example 39 includes all features of example 36, wherein the apparatus of example 39 comprises circuitry for measuring or sensing the voltage level of the battery.

Example 40 includes all features of example 36, wherein the comparator is to cause the switch to couple the second high-side switch to the control node directly or indirectly when a voltage level of the signal is above the threshold.

Example 41 includes all features of example 36, wherein the comparator is to cause the switch to couple the first high-side switch to the control node directly or indirectly when a voltage level of the signal is below the threshold.

Example 42 includes all features of example 29, wherein the low-side switch, and the first and second high-side switches, are to be coupled to an inductor which is to be coupled to a capacitor, and wherein the inductor and the capacitor is to be coupled to a power amplifier.

Example 43 includes all features of example 29, wherein the first DC-DC converter is coupled to the second DC-DC converter via a coupling capacitor.

Example 44 includes all features of example 29, wherein the supply boost circuitry comprises one of: a charge pump or a boost DC-DC converter.

Example 45 includes all features of example 29, wherein the apparatus further comprising: a detection circuit which is to indicate that an input voltage to the first and second high-side switches are equal.

Example 46 includes all features of example 29, wherein the apparatus of example 46 includes a first comparator to compare an envelope signal with a first threshold; a second comparator to compare a battery voltage with a second threshold.

Example 47 is an apparatus which comprises: means for comparing an envelope signal with a threshold; means for boosting a first supply to a second supply; and means for coupling, in response to comparing, one of: a first high-side switch to a control node when the first supply provided to the first low-side switch is lower than the second supply or a second high-side switch to the control node when the first supply provided to the first low-side switch is higher than the second supply.

Example 48 includes all features of example 47, wherein the first high-side switch is coupled to the control node when the envelope signal is below the threshold.

Example 49 includes all features of example 47, wherein the second high-side switch is coupled to the control node when the envelope signal is above the threshold.

Example 50 includes all features of example 47, wherein the threshold is equal to a voltage level of the first supply plus an offset voltage, or wherein the threshold is equal to a voltage level of the first supply minus an offset voltage.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a low-side switch;
   at least two high-side switches coupled to the low-side switch, wherein the low-side switch and the at least two high-side switches are coupled to an output supply rail, wherein the output supply rail is to provide power to a load, wherein the at least two high-side switches comprises a first high-side switch and a second high-side switch, wherein the first high-side switch is coupled to a power supply node separate from the output supply rail, wherein the at least two high-side switches are of a same conductivity type;
   a supply boost circuitry coupled to the second high-side switch and coupled to the power supply node; and
   a high-side switch selection circuit which is to enable one of the at least two high-side switches according to a difference between a signal and a threshold.

2. The apparatus of claim 1, wherein the power supply node is coupled to an external power supply source.

3. The apparatus of claim 2, wherein the external power supply source is one of a battery or converter.

4. The apparatus of claim 1, wherein the supply boost circuitry is to provide an elevated supply to the one of the at least two high-side switches compared to a supply on the power supply node.

5. The apparatus of claim 1, wherein the threshold is substantially equal to a voltage level of the supply node plus an offset voltage, or wherein the threshold is substantially equal to a voltage level of the supply node minus an offset voltage.

6. The apparatus of claim 1 comprises a level-shifter coupled to an output of the high-side switch selection circuit and the second high-side switch.

7. The apparatus of claim 1, wherein the low-side switch is coupled to a control node which is also coupled to the high-side switch selection circuit.

8. The apparatus of claim 7, wherein the control node is to provide one of: a pulse width modulated (PWM) signal, a pulse frequency modulated (PFM) signal, a constant on-time modulated signal, a constant off-time modulated signal, or a signal formed by a combination of the above.

9. The apparatus of claim 7 comprises a comparator to:
   cause the high-side switch selection circuit to couple one of the at least two high-side switches to the control node if a voltage level of the signal is above the threshold; and
   cause the high-side switch selection circuit to couple the other of the at least two high-side switches to the control node if a voltage level of the signal is below the threshold.

10. The apparatus of claim 1, wherein the low-side switch and the at least two high-side switches are coupled to an inductor which is to be coupled to a capacitor, and wherein the inductor and the capacitor are to be coupled to a power amplifier.

11. The apparatus of claim 1, wherein the supply boost circuitry comprises a charge pump or a boost DC-DC converter.

12. The apparatus of claim 1, wherein the low-side switch; the at least two high-side switches; and the supply boost circuitry are part of a first DC-DC converter which is coupled to one or more of: a second DC-DC converter, a charge pump, or a linear amplifier.

13. A system comprising:
    a power amplifier;
    an inductor coupled to the power amplifier;
    a capacitor coupled to the inductor and the power amplifier; and
    a DC-DC converter coupled to the inductor, wherein the DC-DC converter comprises an apparatus which includes:
       a low-side switch;
       at least two high-side switches coupled to the low-side switch, wherein the low-side switch and the at least two high-side switches are coupled to an output supply rail, wherein the output supply rail is to supply power to the power amplifier, and wherein the at least two high-side switches are of a same conductivity type;
       a supply boost circuitry coupled to one of the at least two high-side switches; and a high-side switch selection circuit which is to enable one of the at least two high-side switches according to an output of a comparison circuitry.

14. The system of claim 13, wherein the comparison circuitry comprises:
   a first comparator to compare a signal and with a first threshold; and
   a second comparator to compare a battery voltage with a second threshold separate from the first threshold, wherein the battery voltage is also provided to the supply boost circuitry.

15. The system of claim 14, wherein the signal is an envelope signal, and wherein the threshold is substantially equal to the battery voltage plus an offset voltage, or wherein the threshold is substantially equal to the battery voltage minus an offset voltage.

16. An apparatus comprising:
   a bridge including:
      a low-side switch;
      a first high-side switch coupled to the low-side switch and to a first supply node;
      a supply boost circuitry coupled to the first supply node; and
      a second high-side switch coupled to the low-side switch and to the supply boost circuitry; and
   circuitry coupled to the bridge, wherein the circuitry is to compare an envelope signal with a threshold and to generate an output indicating a compare result, wherein the output is to cause the first high-side switch to couple to a control node when a voltage on the first supply node is greater than a voltage provided by the supply boost circuitry to the second high-side switch.

17. The apparatus of claim 16, wherein the output is to cause the second high-side switch to couple to the control node when the voltage on the first supply node is less than the voltage provided by the supply boost circuitry to the second high-side switch.

18. The apparatus of claim 16, wherein the threshold is equal to a voltage level of the supply plus an offset voltage, or wherein the threshold is equal to a voltage level of the supply minus an offset voltage.

19. The apparatus of claim 16, wherein the second high-side switch is used when its input voltage is larger than the supply on the first supply node.

20. An apparatus comprising:
   a first switch coupled to an output supply rail, wherein the first switch is operable to sink charge from the output supply rail to ground;
   a second switch coupled to the output supply rail, wherein the second switch is operable to source charge to the output supply rail;
   a third switch coupled to the output supply rail, wherein the third switch is operable to source charge to the output supply rail;
   a first circuitry coupled to the third switch, wherein the first circuitry is to raise a supply voltage to the first circuitry; and
   a second circuitry coupled to the second switch, wherein the second circuitry is to enable one of the second or third switches according to a difference between a signal and a threshold.

21. The apparatus of claim 20, wherein the first switch is coupled to a node which is also coupled to the second circuitry.

22. The apparatus of claim 21 comprises a third circuitry is to cause the second circuitry to couple one of the second or third switches to the node if a voltage level of the signal is above the threshold.

23. The apparatus of claim 22, wherein the fourth circuitry is to cause the second circuitry to couple one of the second or third switches to the node if a voltage level of the signal is below the threshold.

24. The apparatus of claim 20, wherein the signal comprises an envelope signal, and wherein the threshold is equal to a voltage plus an offset voltage, or wherein the threshold is equal to the voltage minus an offset voltage, and wherein the voltage is provided by a battery.

* * * * *